(12) United States Patent
Chuang et al.

(10) Patent No.: US 11,276,649 B2
(45) Date of Patent: Mar. 15, 2022

(54) DEVICES AND METHODS HAVING MAGNETIC SHIELDING LAYER

(71) Applicant: Taiwan Semiconductor Manufacturing Co., Ltd., Hsinchu (TW)

(72) Inventors: Harry-Hak-Lay Chuang, Zhubei (TW); Tien-Wei Chiang, Taipei (TW); Chia-Hsiang Chen, Hsinchu (TW); Meng-Chun Shih, Hsinchu (TW); Ching-Huang Wang, Pingjhen (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 19 days.

(21) Appl. No.: 16/711,152

(22) Filed: Dec. 11, 2019

(65) Prior Publication Data
US 2020/0411449 A1     Dec. 31, 2020

Related U.S. Application Data

(60) Provisional application No. 62/868,634, filed on Jun. 28, 2019.

(51) Int. Cl.
*H01L 23/552* (2006.01)
*H05K 9/00* (2006.01)
*H01L 43/02* (2006.01)

(52) U.S. Cl.
CPC ............ *H01L 23/552* (2013.01); *H01L 43/02* (2013.01); *H05K 9/0024* (2013.01)

(58) Field of Classification Search
CPC ....... H01L 23/552; H01L 43/02; H01L 43/08; H01L 43/12; H05K 9/0024
See application file for complete search history.

(56) References Cited

U.S. PATENT DOCUMENTS

| | | | |
|---|---|---|---|
| 2004/0126905 A1 | 7/2004 | Bhattacharyya et al. | |
| 2015/0221598 A1* | 8/2015 | Lee | H01L 43/02 257/295 |
| 2015/0271911 A1* | 9/2015 | Chen | H05K 9/0081 361/760 |
| 2018/0351078 A1* | 12/2018 | Bharat | H01L 24/29 |
| 2020/0006245 A1* | 1/2020 | Chuang | H01L 24/49 |
| 2020/0075442 A1* | 3/2020 | Luo | H01L 24/09 |

FOREIGN PATENT DOCUMENTS

| | | |
|---|---|---|
| TW | 200631159 A | 9/2006 |
| TW | 200635496 A | 10/2006 |

* cited by examiner

*Primary Examiner* — Allan R Wilson
(74) *Attorney, Agent, or Firm* — Seed Intellectual Property Law Group LLP

(57) ABSTRACT

Devices and methods are provided in which a magnetic sensitive semiconductor chip, such as a magnetoresistive random-access memory (MRAM) chip, is shielded from magnetic interference by a magnetic shielding layer. A device includes a housing that defines an exterior surface. A semiconductor chip is disposed within the housing, and the semiconductor chip is spaced apart from the exterior surface of the housing. A magnetic shielding layer is spaced apart from the semiconductor chip by a distance less than 5 mm.

20 Claims, 8 Drawing Sheets

DEVICES AND METHODS HAVING MAGNETIC SHIELDING LAYER

BACKGROUND

In the presence of magnetic fields, such as may be generated by a magnet or the like, some electrical devices may experience operational problems and in some cases failures. For example, an external magnetic field can cause an operation window shift or storage data errors in magnetic sensitive chips or devices, which can result in reading or writing failures.

BRIEF DESCRIPTION OF THE SEVERAL VIEWS OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
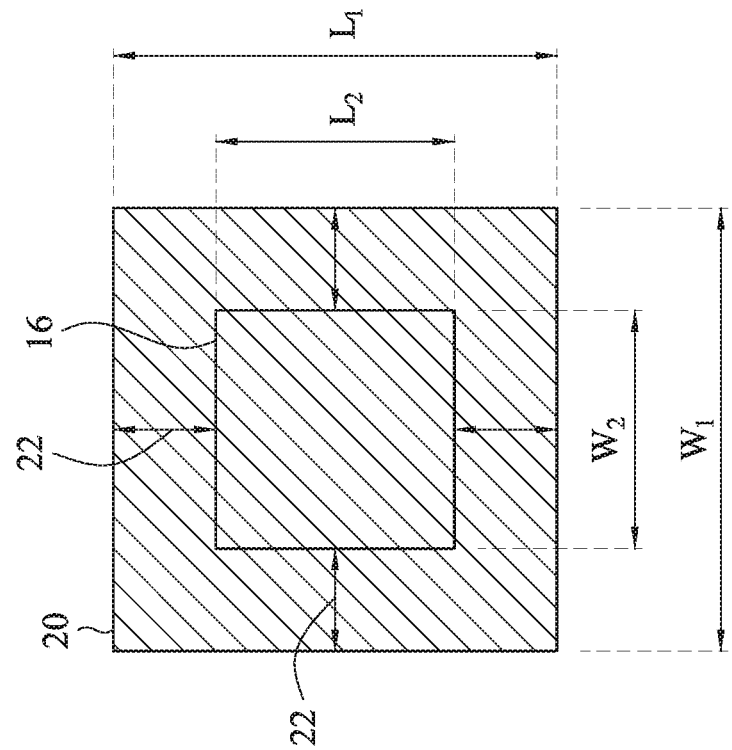
FIG. 1B is a top plan view schematically illustrating relative positioning of the semiconductor chip and the magnetic shielding layer of the device shown in FIG. 1A, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

This application relates to devices, such as a semiconductor device, chip, or package, having a magnetic shielding layer and methods for forming such devices.

In various embodiments, the present disclosure provides devices and methods in which a magnetic shielding layer is provided to protect electrical circuitry, such as a semiconductor chip, from damage due to magnetic fields. The magnetic shielding layer may be provided in particular spatial arrangements with respect to the semiconductor chip, and the magnetic shielding layer may reduce interference at the semiconductor chip caused by an external magnetic field.

Figure 1A:
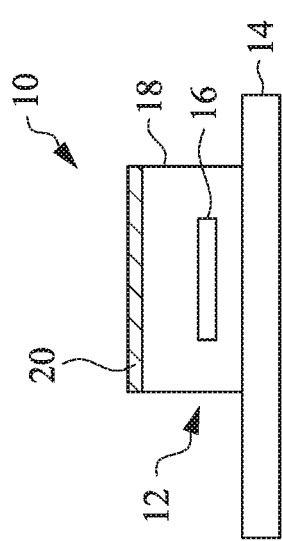
FIG. 1A is a cross-sectional view schematically illustrating a device having a magnetic shielding layer, in accordance with some embodiments.

FIG. 1A is a cross-sectional view schematically illustrating a device 10, in accordance with one or more embodiments of the present disclosure.

The device 10 includes a semiconductor device package 12 and a substrate 14. The semiconductor device package 12 includes at least one semiconductor chip 16. The semiconductor chip 16 may be or include any electrical circuitry, components, features or the like which may be formed on or in a semiconductor material, such as a monocrystalline silicon (Si), amorphous Si, gallium arsenide (GaAs), or any other semiconductor material or semiconductor substrate.

In some embodiments, the semiconductor chip 16 is a magnetic sensitive chip that is sensitive to magnetic fields. For example, in some embodiments, the semiconductor chip 16 includes one or more electrical circuitry, components, features or the like which may be operationally affected by magnetic fields, such as may exist when a magnetic is brought into close proximity of the device 10. In some embodiments, the semiconductor chip 16 is a magnetic sensitive memory chip, such as a magnetoresistive random-access memory (MRAM) chip. In contrast to conventional random-access memory (RAM) chip technologies, data in MRAM is stored by magnetic storage elements as opposed to storage as electric charge or current flows. The magnetic storage elements are formed from two ferromagnetic plates, each of which can hold a magnetization, separated by a thin insulating layer. One of the two plates may be a permanent magnet set to a particular polarity, while the other plate may have a variable magnetization which can be changed based on application of an external field to store data. Due to the use of magnetic storage elements in an MRAM chip, such MRAM chips are particularly susceptible to unintended effects due to the presence of an external magnetic field caused, for example, by a magnetic being brought into proximity of the MRAM chip.

In some embodiments, the semiconductor chip 16 is disposed within the semiconductor device package 12. For example, the semiconductor chip 16 may be encapsulated within the semiconductor device package 12 by an encapsulant 18. The encapsulant 18 may be any encapsulant material suitable for encapsulating the semiconductor chip 16, and optionally additional components, within the semiconductor device package 12. In some embodiments, the encapsulant 18 may be an epoxy mold compound (EPC). In some embodiments, the encapsulant 18 may be formed of an electrically insulating material or a thermally insulating material.

In various embodiments, the substrate 14 may be any substrate suitable for supporting the semiconductor device package 12. For example, in some embodiments, the semiconductor device package 12 is mechanically coupled to the substrate 14. In some embodiments, the substrate 14 is electrically coupled to the semiconductor device package 12, e.g., to the semiconductor chip 16 included within the semiconductor device package 12. In some embodiments, the substrate 14 is a printed circuit board (PCB) having one or more electrical contacts or leads (not shown) that electrically couple the substrate to one or more corresponding electrical contacts or leads (not shown) of the semiconductor device package 12. The substrate 14 may be electrically coupled to additional electrical devices, packages or the like, which in some embodiments, may be electrically coupled to the semiconductor device package 12 via the substrate 14.

The semiconductor device package 12 may be any type of semiconductor device package, including, for example, integrated fan out (InFO) packages, chip-on-wafer-on-substrate (CoWoS) packages, wire bond packages, ball grid array packages, flip chip packages, or any other type of semiconductor device package.

A magnetic shielding layer 20 is disposed proximate to the semiconductor chip 16. In some embodiments, the magnetic shielding layer 20 is attached to the semiconductor device package 12. For example, in some embodiments, the magnetic shielding layer 20 may be attached to a surface (e.g., an upper surface) of the semiconductor device package 12, as shown in FIG. 1A. In some embodiments, the magnetic shielding layer 20 may be formed as a part of the semiconductor device package 12. For example, the magnetic shielding layer 20 may be formed at least partially within the semiconductor device package 12, such as at least partially embedded in or otherwise surrounded by the encapsulant 18. In some embodiments, the magnetic shielding layer 20 may be attached to the encapsulant 18 by the encapsulant 18 itself, e.g., the encapsulant 18 may secure and hold the magnetic shielding layer 20 in a desired position. In other embodiments, the magnetic shielding layer 20 may be attached to the encapsulant 18 by an adhesive material or the like.

The magnetic shielding layer 20 serves to shield the semiconductor chip 16 from magnetic interference or the like, for example, as may be caused by a magnet brought into proximity of the device 10. More particularly, in some embodiments, the magnetic shielding layer 20 serves to redirect magnetic flux (e.g., from a magnet or magnetic structure positioned near the device 10) and significantly reduce magnetic interference on magnetic sensitive devices, such as the semiconductor chip 16.

While the device 10 is shown in FIG. 1A as having a single magnetic shielding layer 20, in some embodiments, the device 10 may include a plurality of magnetic shielding layers 20. For example, magnetic shielding layers 20 may be provided on multiple surfaces of the semiconductor device package 12, which provides enhanced magnetic shielding of the semiconductor chip 16 from various different directions.

FIG. 1B is a top plan view schematically illustrating relative positioning of the semiconductor chip 16 and the magnetic shielding layer 20. In some embodiments, the magnetic shielding layer 20 completely overlaps the semiconductor chip 16. As shown in FIG. 1B, the magnetic shielding layer 20 may have an area (e.g., a surface area or an area at an upper surface of the magnetic shielding layer 20) that is greater than an area of the semiconductor chip 16 (e.g., a surface area or an are at an upper surface of the semiconductor chip 16). For example, a width $W_1$ of the magnetic shielding layer 20 may be greater than a width $W_2$ of the semiconductor chip 16. Similarly, a length $L_1$ of the magnetic shielding layer 20 may be greater than a length $L_2$ of the semiconductor chip 16.

In some embodiments, portions of the magnetic shielding layer 20 may extend beyond an outer periphery of the semiconductor chip 16, as shown in FIG. 1B. The magnetic shielding layer 20 may extend laterally outward beyond one or more sides of the semiconductor chip 16, and in some embodiments, the magnetic shielding layer 20 may extend laterally outward beyond each of four sides of the semiconductor chip 16, as shown. In some embodiments, the magnetic shielding layer 20 extends beyond the outer periphery of the semiconductor chip 16 by a distance equal to or greater than 1 mm. In some embodiments, the magnetic shielding layer 20 extends between about 1 mm to about 300 mm beyond the outer periphery of the semiconductor chip 16, as indicated by the arrows 22. The distance at which the magnetic shielding layer 20 extends beyond the outer periphery of the semiconductor chip 16 may be selected as desired to provide desired magnetic shielding effects. For example, by increasing the distance at which the magnetic shielding layer 20 extends beyond the outer periphery of the semiconductor chip 16, the magnetic shielding effect that is provided by the magnetic shielding layer 20 may be increased. This may be true up to some practical limit, beyond which further increasing the distance of extension of the magnetic shielding layer 20 does not provide additional increases in the magnetic shielding effect.

The magnetic shielding layer 20 may be formed of any material suitable to redirect magnetic flux and reduce magnetic interference on magnetic sensitive devices (e.g., the semiconductor chip 16). In some embodiments, the magnetic shielding layer 20 includes a first material (e.g., a magnetic material) including at least one of: iron (Fe), cobalt (Co), nickel (Ni), NiFe, CoFe, or any combination thereof. The magnetic shielding layer 20 may further include a second material (e.g., a doping material) including at least one of: carbon (C), molybdenum (Mo), chromium (Cr), copper (Cu), niobium (Nb), titanium (Ti), manganese (Mn), aluminum (Al), silicon (Si), tungsten (W), or vanadium (V). In some embodiments, the magnetic shielding layer 20 is formed of 80% to 100% of the first material and 0% to 20% of the second material.

In some embodiments, the magnetic shielding layer 20 includes 80% to 100% of CoFe and 0% to 20% of Si, which may be a dopant element. In some embodiments, the magnetic shielding layer 20 is silicon-steel (or electrical steel).

The magnetic shielding layer 20 may have any thickness suitable to redirect magnetic flux and reduce magnetic interference on magnetic sensitive devices (e.g., the semiconductor chip 16). In some embodiments, the magnetic shielding layer 20 has a thickness that is less than 5 mm, and in some embodiments, the thickness of the magnetic shielding layer 20 is less than 1 mm. In some embodiments, the thickness of the magnetic shielding layer 20 is within a range from 0.1 mm to 1 mm. Thicknesses within this range provide good results, e.g., in the way of reduction of interference caused by magnetic fields (e.g., by the presence of a proximate magnet), without significantly increasing a thickness of the semiconductor device package 12 or the device 10.

Figure 2B:
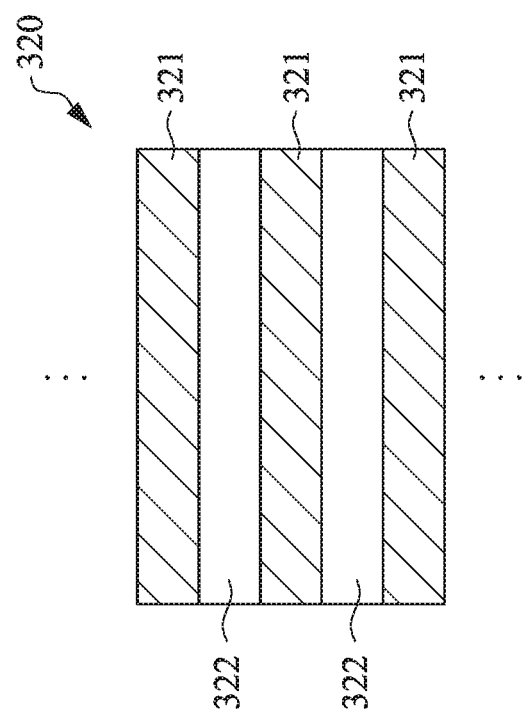
FIG. 2B is a cross-sectional view illustrating a magnetic shielding layer having a multi-layer structure, in accordance with some embodiments.
Figure 2A:
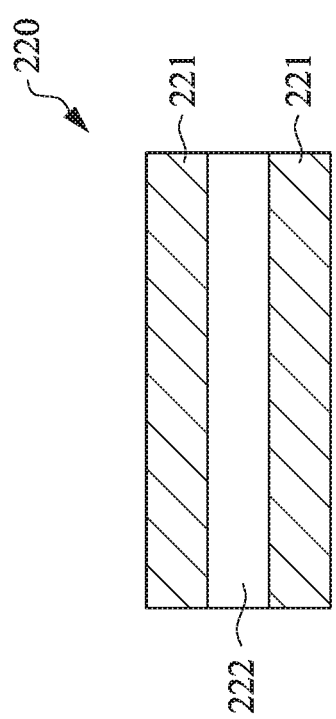
FIG. 2A is a cross-sectional view illustrating a magnetic shielding layer having a tri-layer structure, in accordance with some embodiments.

In some embodiments, the magnetic shielding layer 20 may be formed of a plurality of material layers. FIG. 2A is a cross-sectional view illustrating a magnetic shielding layer 220 having a tri-layer structure, and FIG. 2B is a cross-sectional view illustrating a magnetic shielding layer 320 having a multi-layer structure.

As shown in FIG. 2A, in some embodiments, the magnetic shielding layer 220 may have a tri-layer structure. The tri-layer structure may include two magnetic layers 221, and an insulating layer 222 positioned between the magnetic layers 221. The insulating layer 222 may be formed of any electrically insulating material. In some embodiments, the insulating layer 222 may be formed of at least one of glass, polymer, or ceramic materials.

The magnetic layers 221 may be the same or substantially the same as the magnetic shielding layer 20 previously described herein, and may be formed of the same materials as the magnetic shielding layer 20. For example, in some embodiments, the magnetic layers 221 of the magnetic shielding layer 220 are formed of about 80% CoFe and about 20% Si. In some embodiments, each of the magnetic layers 221 has a thickness less than 1 mm, and in some embodiments, the thickness of each of the magnetic layers 221 is between about 0.1 mm and 1 mm.

The insulating layer 222 serves to reduce electrical losses due to eddy currents (e.g., induced currents) through the magnetic shielding layer 220, for example, in the presence of an alternating current (AC) electromagnetic field. That is, the presence of the insulating layer 222 sandwiched between the two magnetic layers 221 reduces or prevents induced or eddy currents from flowing through the magnetic shielding layer 220, and this reduction in induced current results in a reduction in a heating effect that is otherwise caused by such currents. Thus, heating of the magnetic shielding layer 220 due to AC electromagnetic fields is reduced by inclusion of the insulating layer 222 in the magnetic shielding layer 220.

In some embodiments, the insulating layer 222 has a thickness less than 1 mm, and in some embodiments, the thickness of the insulating layer 222 is between about 0.1 µm and 1 mm. The total thickness of the magnetic shielding layer 220, in some embodiments, is less than 5 mm.

As shown in FIG. 2B, the magnetic shielding layer 320 may have a multi-layer structure in which a plurality of insulating layers 322 and a plurality of magnetic layers 321 are alternately disposed in a stacked arrangement. For example, adjacent ones of the magnetic layers 321 are spaced apart by at least one insulating layer 322, and adjacent ones of the insulating layers 322 are spaced apart by at least one magnetic layer 321. While the magnetic shielding layer 320 is shown in FIG. 2B as having three magnetic layers 321 and two insulating layers 322, it will be readily appreciated that in various embodiments any number of magnetic layers 321 and insulating layers 322 may be included, for example, by repeating the alternating structure of magnetic layers 321 and insulating layers 322.

The insulating layers 322 may be the same or substantially the same as the insulating layers 222 previously described herein. Similarly, the magnetic layers 321 may be the same or substantially the same as the magnetic layers 221 previously described herein, and in some embodiments, the magnetic layers 321 may be the same or substantially the same as the magnetic shielding layer 20 previously described herein.

For example, in some embodiments, the magnetic layers 321 of the magnetic shielding layer 320 are formed of about 80% CoFe and about 20% Si. In some embodiments, each of the magnetic layers 321 has a thickness less than 1 mm, and in some embodiments, the thickness of each of the magnetic layers 321 is between about 0.1 mm and 1 mm.

The insulating layers 322 serve to reduce electrical losses due to eddy currents (e.g., induced currents) through the magnetic shielding layer 320, for example, as previously described herein with respect to the insulating layer 222 of the magnetic shielding layer 220 shown in FIG. 2A.

In some embodiments, the insulating layers 322 have a thickness less than 1 mm, and in some embodiments, the thickness of the insulating layers 322 is between about 0.1 µm and 1 mm. The total thickness of the magnetic shielding layer 320, in some embodiments, is less than 5 mm.

In various embodiments, the magnetic shielding layer 220 having a tri-layer structure as shown in FIG. 2A or the magnetic shielding layer 320 having the multi-layer structure as shown in FIG. 2B may be utilized as the magnetic shielding layer 20 described herein.

Figure 3:
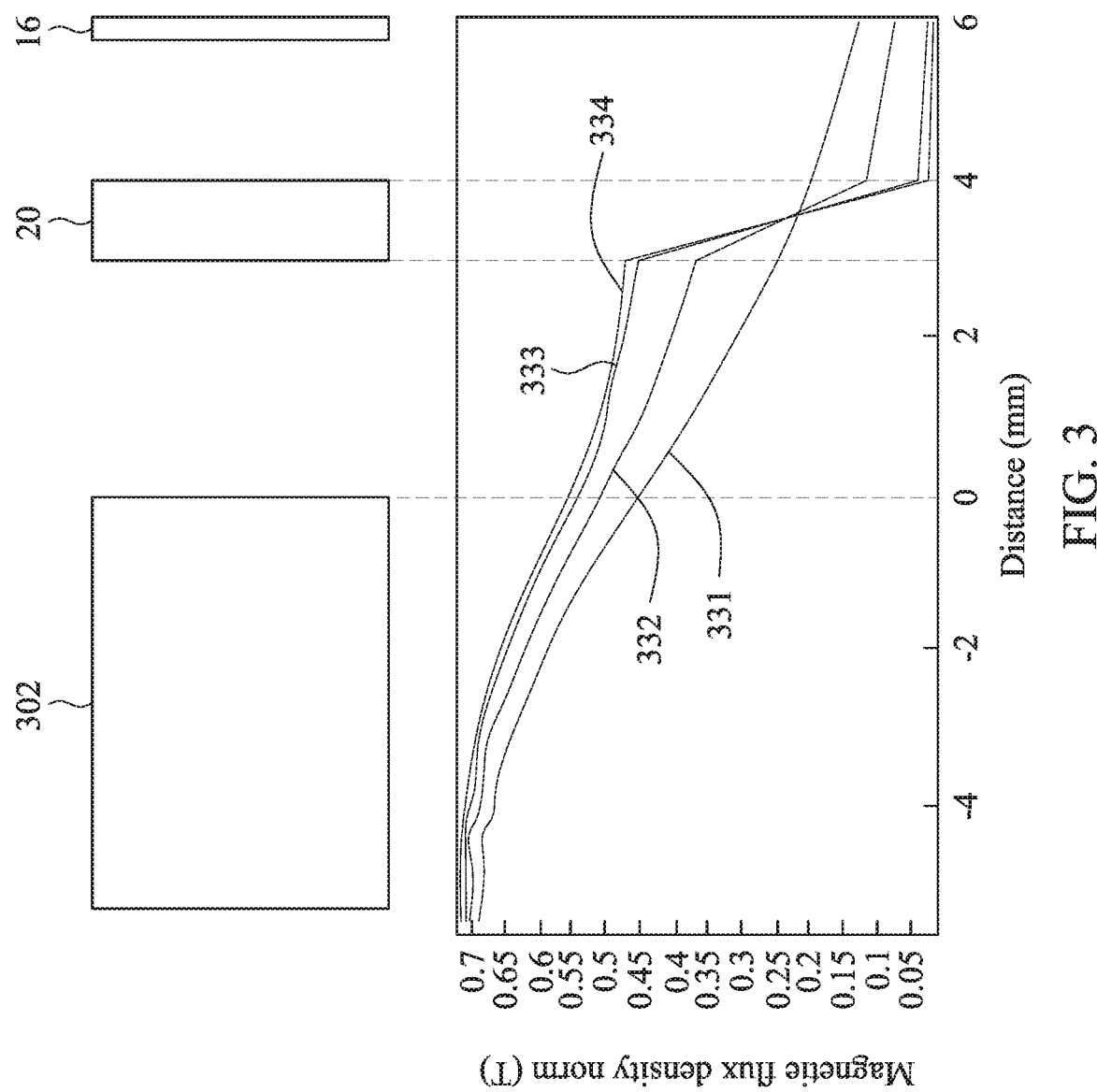
FIG. 3 is a graph illustrating the variance in magnetic flux density when the magnetic permeability of the magnetic shielding layer is varied, in accordance with some embodiments.

FIG. 3 is a graph illustrating the variance in magnetic flux density when the magnetic permeability of the magnetic shielding layer 20 is varied.

Magnetic flux density (B) is related to the magnetic field strength (H) by the following equation:

$$B=\mu H=\mu_0 \mu_r H,$$

where $\mu_r$ is relative permeability, which is a ratio of the magnetic permeability of a specific medium ($\mu$) (e.g., the magnetic permeability of the magnetic shielding layer 20) to the magnetic permeability of free space ($\mu_0$). The magnetic permeability of free space ($\mu_0$) is approximately equal to: $4\pi \times 10^{-7}$ N·A$^{-2}$.

In the graph shown in FIG. 3, the x-axis represents distance in millimeters (mm), and the y-axis represents magnetic flux density. In the experiment reflected in the graph of FIG. 3, a magnet 302 has a front edge aligned with the 0 position along the x-axis, e.g., the front surface of the magnet 302 is at the 0 mm position. The magnetic shielding layer 20 is spaced apart from the front surface of the magnet 302 by about 3 mm, so that a surface of the magnetic shielding layer 20 that faces the front surface of the magnet 302 is about 3 mm away from the front surface of the magnet 302.

The magnetic shielding layer 20 in the example shown in FIG. 3 has a thickness of about 1 mm. The semiconductor chip 16 is spaced apart from the magnetic shielding layer 20 by a distance of about 2 mm. That is, a surface of the magnetic shielding layer 20 that faces the semiconductor chip 16 is about 2 mm away from the semiconductor chip 16.

The graph of FIG. 3 includes four lines, each of the lines corresponding to a different relative permeability (w) for the magnetic shielding layer 20. More particularly, a first line 331 corresponds to a relative permeability of 1, a second line 332 corresponds to a relative permeability of 10, a third line 333 corresponds to a relative permeability of 100, and a fourth line 334 corresponds to a relative permeability of 1000.

As can be seen in the graph of FIG. 3, as the relative permeability of the magnetic shielding layer 20 is increased (e.g., from the first line 331 to the fourth line 334), the magnetic flux density at the position of the semiconductor chip 16 decreases. This is because materials having higher relative permeability have a greater ability to redirect the magnetic flux of the magnet 302. Accordingly, by increasing the relative permeability of the magnetic shielding layer 20, the magnetic flux of the magnet 302 may be redirected, e.g., away from the semiconductor chip 16, thereby reducing the magnetic flux density at the semiconductor chip 16. This results in reduced magnetic interference at the semiconductor chip 16.

In some embodiments, the magnetic shielding layer 20 may have a relative permeability that is greater than 100, and in some embodiments, the relative permeability of the magnetic shielding layer 20 may be within a range of about 100 to about 1000.

Figure 4:
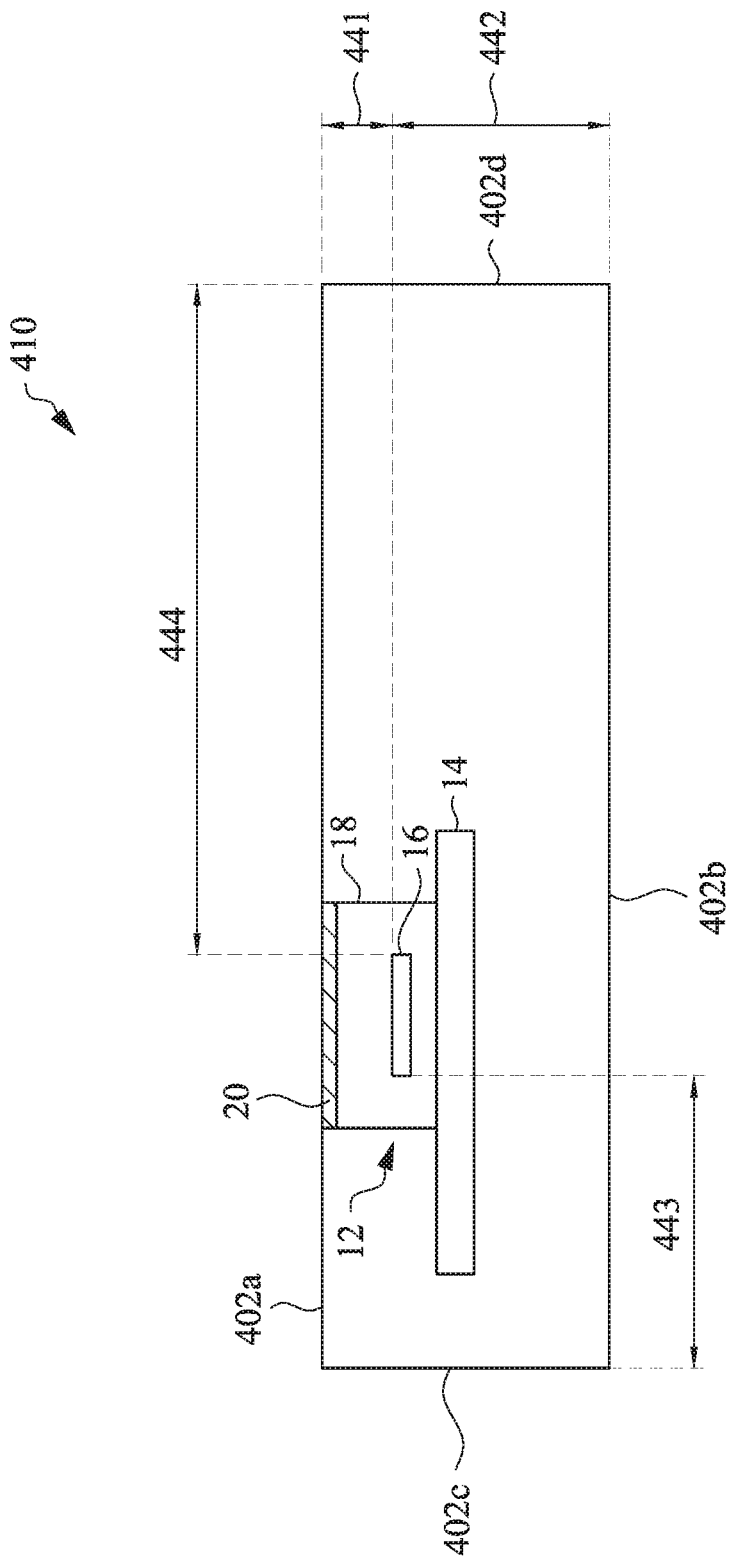
FIG. 4 is a cross-sectional view schematically illustrating an electronic device having a magnetic shielding layer, in accordance with some embodiments.

FIG. 4 is a cross-sectional view schematically illustrating an electronic device 410, in accordance with one or more embodiments of the present disclosure.

In some embodiments, the electronic device 410 includes a housing 402 defining an exterior surface of the electronic device 410. The electronic device 410 may be any electronic device, including, for example, a smart phone, a display device, a tablet computer, or the like. The housing 402, which defines an exterior surface of the electronic device 410, may be formed of any suitable material, and in some embodiments, the housing 402 may include glass, polymers, metals, ceramics, or the like.

The electronic device 410 may include the device 10 as previously described herein. For example, the device 10 may be disposed at least partially within the housing 402 of the electronic device 410. The device 10 may include the substrate 14, such as a PCB, and the package 12. The package 12 includes at least one semiconductor chip 16, which may be a magnetic sensitive chip such as a MRAM chip.

The magnetic shielding layer 20 is disposed proximate to the semiconductor chip 16. In some embodiments, the magnetic shielding layer 20 is attached to the semiconductor device package 12. For example, in some embodiments, the magnetic shielding layer 20 may be attached to a surface (e.g., an upper surface) of the semiconductor device package 12, as shown in FIG. 4.

The magnetic shielding layer 20 may be positioned adjacent to a surface of the housing 402. For example, the magnetic shielding layer 20 may be positioned adjacent to, and in some embodiments in contact with, an interior surface of the housing 402. In some embodiments, the magnetic shielding layer 20 may be positioned at the surface of the housing 402, so that the magnetic shielding layer 20 is substantially coplanar with the exterior surface of the housing 402. The housing 402 is illustrated in FIG. 4 as having opposite first and second surfaces 402a, 402b (which may be, for example, front and rear surfaces) and opposite third and fourth surfaces 402c, 402d (which may be, for example, lateral or side surfaces). However, it will be readily appreciated that any number of surfaces may be included in the housing 402, and may be arranged in any geometrical shape.

The magnetic shielding layer 20 serves to redirect magnetic flux (e.g., from a magnet or magnetic structure positioned near the housing 402 of the electronic device 410) and significantly reduce magnetic interference on magnetic sensitive devices, such as the semiconductor chip 16.

In some embodiments, the magnetic shielding layer 20 is positioned between the semiconductor chip 16 and the exterior surface of the housing 402.

The positioning of the device 10 within the housing 402 of the electronic device 410 may be selected to provide improved magnetic immunity (e.g., improved magnetic shielding) of the semiconductor chip 16. In particular, a distance 441 between the semiconductor chip 16 and a first surface 402a (e.g., exterior surface) of the housing 402 of the electronic device 410 (i.e., the surface 402a on which the magnetic layer 20 is disposed in contact with or adjacent to) may be greater than 0.1 mm. In some embodiments, the distance 441 is less than 5 mm. In some embodiments, the distance 441 is less than 3 mm. In some embodiments, the distance 441 is within a range from about 0.1 mm to about 5 mm. Since the magnetic shielding layer 20 is disposed in contact with or adjacent to the surface 402a of the housing 402, the distance 441 substantially corresponds to a distance between the magnetic shielding layer 20 and the semiconductor chip 16. The distance 441 may be a distance between the semiconductor chip 16 and a surface of the housing 402 that is nearest to the semiconductor chip 16. That is, the first surface 402a of the housing 402 may be a surface that is nearest to the semiconductor chip 16.

A distance 442 between the semiconductor chip 16 and the second surface (e.g., a rear surface) 402b of the housing 402 may be greater than 3 mm in some embodiments. In some embodiments, the distance 442 is greater than 10 mm. In some embodiments, the distance 442 is within a range from about 3 mm to about 300 mm. Since, in some embodiments, the magnetic shielding layer 20 is not disposed between the semiconductor chip 16 and the second surface 402b, the distance 442 should be sufficient to avoid significant effects of magnetic interference if a magnet is brought into close proximity with the second surfaced 402b of the housing 402. Since magnetic flux decays with distance, the distance 442 may be selected to suitably avoid magnetic interference in the presence of a magnet. In some embodiments, the distance 442 being greater than 3 mm is suitable, while in other embodiments, a distance greater than 10 mm or greater than 100 mm may be selected to provide greater avoidance of magnetic interference.

Distances 443, 444 (e.g., lateral distances) between respective sides of the semiconductor chip 16 and the third and fourth surfaces 402c, 402d may be greater than 1 mm in some embodiments. In some embodiments, the distances 443, 444 are greater than 10 mm. In some embodiments, the distances 443, 444 are within a range from about 1 mm to about 300 mm.

Through control of the distances (e.g., the distances 441, 442, 443, 444) between the semiconductor chip 16 and the surfaces of the electronic device 410, and through inclusion of the magnetic shielding layer 20, the semiconductor chip 16 may substantially avoid negative or unwanted effects of magnetic interference.

The device 10 may be positioned within the housing 402, and secured at any desired position within the housing 402, by any suitable techniques. For example, in various embodiments, the device 10 may be secured at a selected or desired position within the housing 402 by any mounting brackets, fasteners, adhesive materials, or the like.

FIGS. 5 through 10 are cross-sectional views schematically illustrating various electronic devices, in accordance with embodiments of the present disclosure. The electronic devices illustrated in FIGS. 5 through 10 may be substantially the same in many respects as the electronic device 410 illustrated and described with respect to FIG. 4, except for the differences that will be discussed below.

Figure 5:
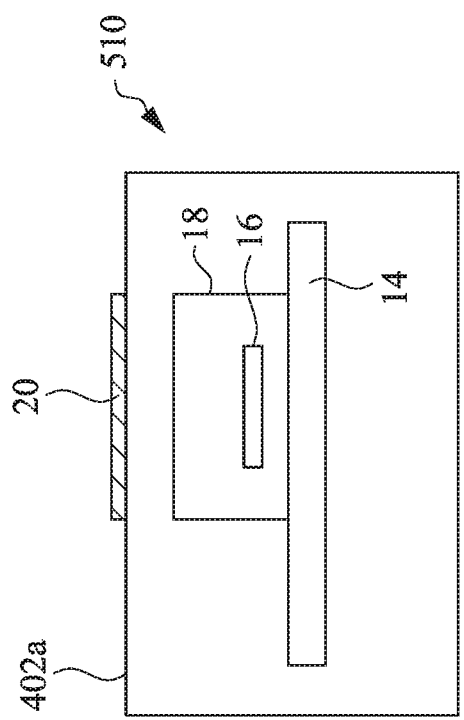
FIGS. 5 through 10 are cross-sectional views schematically illustrating electronic devices having magnetic shielding layers disposed in various different positions or arrangements, in accordance with some embodiments.

FIG. 5 illustrates an electronic device 510, in accordance with one or more embodiments of the present disclosure. The electronic device 510 is substantially the same as the electronic device 410 illustrated and described with respect to FIG. 4, except that the magnetic shielding layer 20 is disposed on the exterior surface 402a of the housing 402 of the electronic device 510.

The distances between the magnetic shielding layer 20, the semiconductor chip 16, and the various surfaces of the housing 402 may be substantially the same as previously described herein with respect to the electronic device 410 shown in FIG. 4. For example, the distance between the magnetic shielding layer 20 and the semiconductor chip 16 may be within a range from about 0.1 mm to about 5 mm in some embodiments.

The magnetic shielding layer 20 may be attached to the exterior of the surface 402a of the housing 402 by any suitable technique, including, for example, by use of an adhesive material or the like. The semiconductor chip 16 may be disposed within the encapsulant 18 and may be mechanically and electrically coupled to the substrate 14, which may be a PCB in some embodiments. The semiconductor chip 16 may be positioned within the housing 402 with the magnetic shielding layer 20 completely overlapping the semiconductor chip 16, for example, as shown and described with respect to FIG. 1B.

In the electronic device 510 shown in FIG. 5, the magnetic shielding layer 20 may be separate from the semiconductor device package in which the semiconductor chip 16 and the encapsulant 18 are formed.

Figure 6:
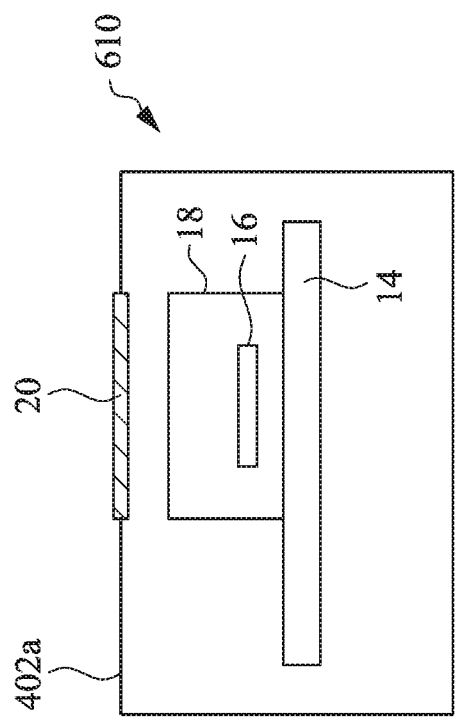

FIG. 6 illustrates an electronic device 610, in accordance with one or more embodiments of the present disclosure. The electronic device 610 is substantially the same as the electronic device 410 illustrated and described with respect to FIG. 4, except that the magnetic shielding layer 20 is embedded in the housing 402. For example, the magnetic shielding layer 20 may be embedded in the surface 402a of the housing 402 of the electronic device 610.

The distances between the magnetic shielding layer 20, the semiconductor chip 16, and the various surfaces of the housing 402 may be substantially the same as previously described herein with respect to the electronic device 410 shown in FIG. 4. For example, the distance between the magnetic shielding layer 20 and the semiconductor chip 16 may be within a range from about 0.1 mm to about 5 mm in some embodiments.

The magnetic shielding layer 20 may be embedded in the surface 402a of the housing 402 by any suitable technique. In some embodiments, the magnetic shielding layer 20 may be inserted into an opening or aperture formed in the surface 402a of the housing, and the magnetic shielding layer 20 may be secured within the opening or aperture by a sealing material, adhesive, fasteners, or the like.

The semiconductor chip 16 may be disposed within the encapsulant 18 and may be mechanically and electrically coupled to the substrate 14, which may be a PCB in some embodiments. The semiconductor chip 16 may be positioned within the housing 402 with the magnetic shielding layer 20 completely overlapping the semiconductor chip 16, for example, as shown and described with respect to FIG. 1B.

In the electronic device 610 shown in FIG. 6, the magnetic shielding layer 20 may be separate from the semiconductor device package in which the semiconductor chip 16 and the encapsulant 18 are formed.

Figure 7:
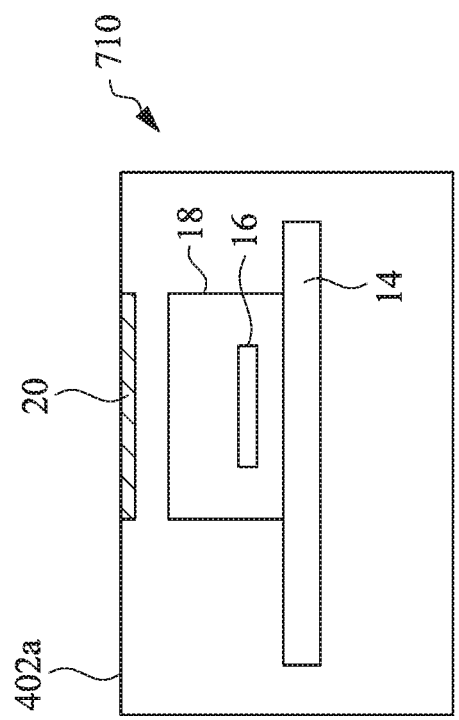

FIG. 7 illustrates an electronic device 710, in accordance with one or more embodiments of the present disclosure. The electronic device 710 is substantially the same as the electronic device 410 illustrated and described with respect to FIG. 4, except that the magnetic shielding layer 20 is disposed on an interior of the surface 402a of the housing 402 of the electronic device 710, and the magnetic shielding layer 20 is spaced apart from the semiconductor device package in which the semiconductor chip 16 and the encapsulant 18 are formed.

The distances between the magnetic shielding layer 20, the semiconductor chip 16, and the various surfaces of the housing 402 may be substantially the same as previously described herein with respect to the electronic device 410 shown in FIG. 4. For example, the distance between the magnetic shielding layer 20 and the semiconductor chip 16 may be within a range from about 0.1 mm to about 5 mm in some embodiments.

The magnetic shielding layer 20 may be attached to the interior of the surface 402a of the housing 402 by any suitable technique, including, for example, by use of an adhesive material or the like. The semiconductor chip 16 may be disposed within the encapsulant 18 and may be mechanically and electrically coupled to the substrate 14, which may be a PCB in some embodiments. The semiconductor chip 16 may be positioned within the housing 402 with the magnetic shielding layer 20 completely overlapping the semiconductor chip 16, for example, as shown and described with respect to FIG. 1B.

Figure 8:
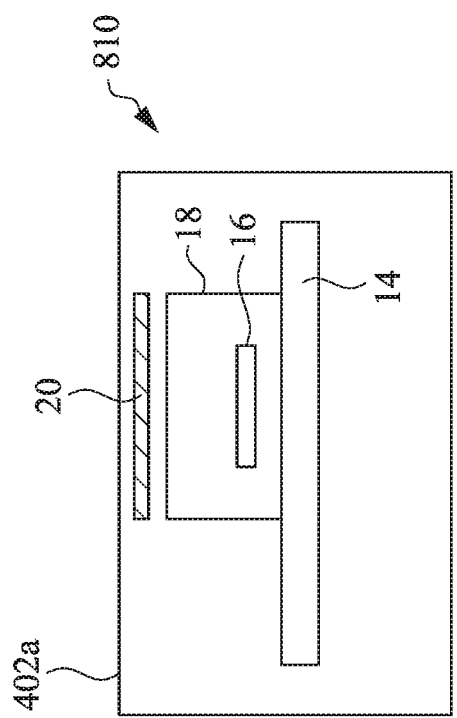

FIG. 8 illustrates an electronic device 810, in accordance with one or more embodiments of the present disclosure. The electronic device 810 is substantially the same as the electronic device 410 illustrated and described with respect to FIG. 4, except that the magnetic shielding layer 20 is disposed between an interior of the surface 402a of the housing 402 of the electronic device 810 and the semiconductor chip 16, and the magnetic shielding layer 20 is spaced apart from the interior of the surface 402a and from the semiconductor device package in which the semiconductor chip 16 and the encapsulant 18 are formed.

The distances between the magnetic shielding layer 20, the semiconductor chip 16, and the various surfaces of the housing 402 may be substantially the same as previously described herein with respect to the electronic device 410 shown in FIG. 4. For example, the distance between the magnetic shielding layer 20 and the semiconductor chip 16 may be within a range from about 0.1 mm to about 5 mm in some embodiments.

The magnetic shielding layer 20 may be secured in a desired location between the interior of the surface 402a of the housing 402 and the semiconductor chip 16 by any suitable technique, including, for example, by use of an adhesive material, mounting brackets, fasteners, or the like. The semiconductor chip 16 may be disposed within the encapsulant 18 and may be mechanically and electrically coupled to the substrate 14, which may be a PCB in some embodiments. The semiconductor chip 16 may be positioned within the housing 402 with the magnetic shielding layer 20 completely overlapping the semiconductor chip 16, for example, as shown and described with respect to FIG. 1B.

Figure 9:
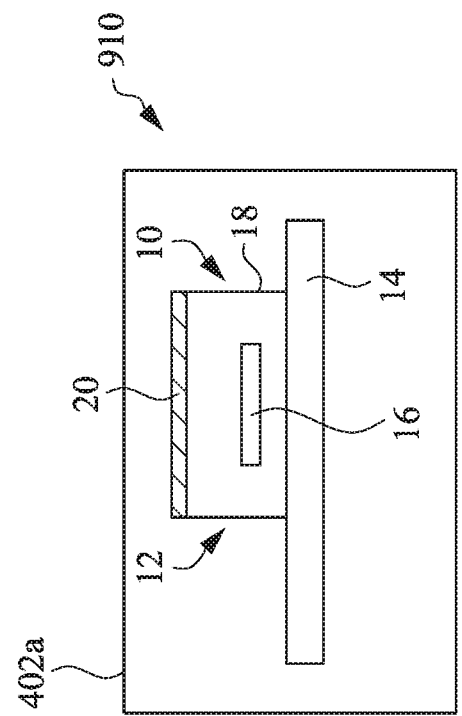

FIG. 9 illustrates an electronic device 910, in accordance with one or more embodiments of the present disclosure. The electronic device 910 is substantially the same as the electronic device 410 illustrated and described with respect to FIG. 4, except that the device 10 is spaced apart from an interior of the surface 402a of the housing 402 of the electronic device 910.

The device 10 of the electronic device 910 may be substantially the same as the device 10 previously described herein. For example, the magnetic shielding layer 20 may be form as a part of, or may be attached to, the semiconductor device package 12, e.g., at an upper surface of the semiconductor device package 12. The magnetic shielding layer 20 is spaced apart from the interior of the surface 402a of the housing 402 of the electronic device 910.

The distances between the magnetic shielding layer 20, the semiconductor chip 16, and the various surfaces of the housing 402 may be substantially the same as previously described herein with respect to the electronic device 410 shown in FIG. 4. For example, the distance between the magnetic shielding layer 20 and the semiconductor chip 16 may be within a range from about 0.1 mm to about 5 mm in some embodiments.

The device 10 may be secured in a desired location within the housing 402 by any suitable technique, including, for example, by use of an adhesive material, mounting brackets, fasteners, or the like. The semiconductor chip 16 may be disposed within the encapsulant 18 and may be mechanically and electrically coupled to the substrate 14, which may be a PCB in some embodiments. The magnetic shielding layer 20 may completely overlap the semiconductor chip 16, for example, as shown and described with respect to FIG. 1B.

Figure 10:
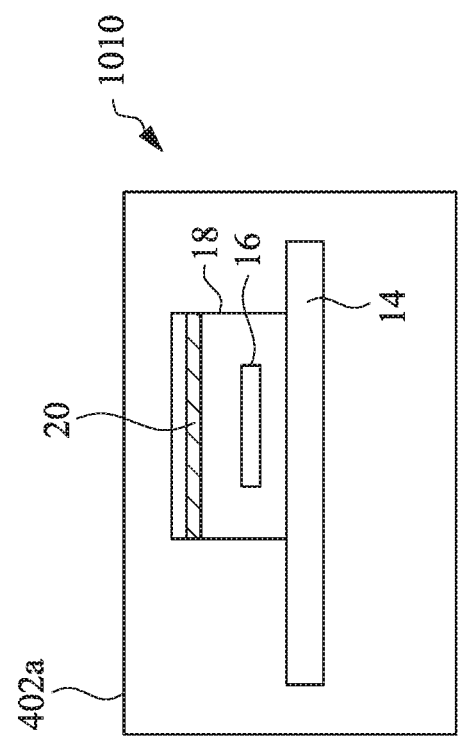

FIG. 10 illustrates an electronic device 1010, in accordance with one or more embodiments of the present disclosure. The electronic device 1010 is substantially the same as the electronic device 410 illustrated and described with respect to FIG. 4, except that the device 110 is spaced apart from an interior of the surface 402a of the housing 402 of the electronic device 1010, and the magnetic shielding layer 20 is embedded within the semiconductor device package 12.

The device 10 of the electronic device 1010 may be substantially the same as the device 10 previously described herein, except that the magnetic shielding layer 20 is embedded within the semiconductor device package 12, instead of being attached to the surface of the semiconductor device package 12. The magnetic shielding layer 20 may be embedded within the semiconductor device package 12 by any suitable technique, including, for example, by forming the encapsulant 18 to at least partially surround the magnetic shielding layer 20 when the magnetic shielding layer 20 is positioned at a desired location. For example, the encapsulant 18 may be formed abutting upper and lower surfaces of the magnetic shielding layer 20. In some embodiments, the magnetic shielding layer 20 may be completely surrounded by the encapsulant 18, for example, with the encapsulant 18 abutting upper and lower surfaces, as well as side surfaces of the magnetic shielding layer 20. The magnetic shielding layer 20 is spaced apart from the interior of the surface 402a of the housing 402 of the electronic device 1010.

The distances between the magnetic shielding layer 20, the semiconductor chip 16, and the various surfaces of the housing 402 may be substantially the same as previously described herein with respect to the electronic device 410 shown in FIG. 4. For example, the distance between the magnetic shielding layer 20 and the semiconductor chip 16 may be within a range from about 0.1 mm to about 5 mm in some embodiments.

The device 10 may be secured in a desired location within the housing 402 by any suitable technique, including, for example, by use of an adhesive material, mounting brackets, fasteners, or the like. The semiconductor chip 16 may be disposed within the encapsulant 18 and may be mechanically and electrically coupled to the substrate 14, which may be a PCB in some embodiments. The magnetic shielding layer 20 may completely overlap the semiconductor chip 16, for example, as shown and described with respect to FIG. 1B.

While the electronic devices are shown and described herein as having a single magnetic shielding layer 20, in some embodiments, the electronic devices may include a plurality of magnetic shielding layers 20. For example, magnetic shielding layers 20 may be provided on multiple surfaces of the housing of the electronic devices, on multiple surfaces of the semiconductor device package, or the like, which provides enhanced magnetic shielding of the semiconductor chip 16 from various different directions.

Figure 11:
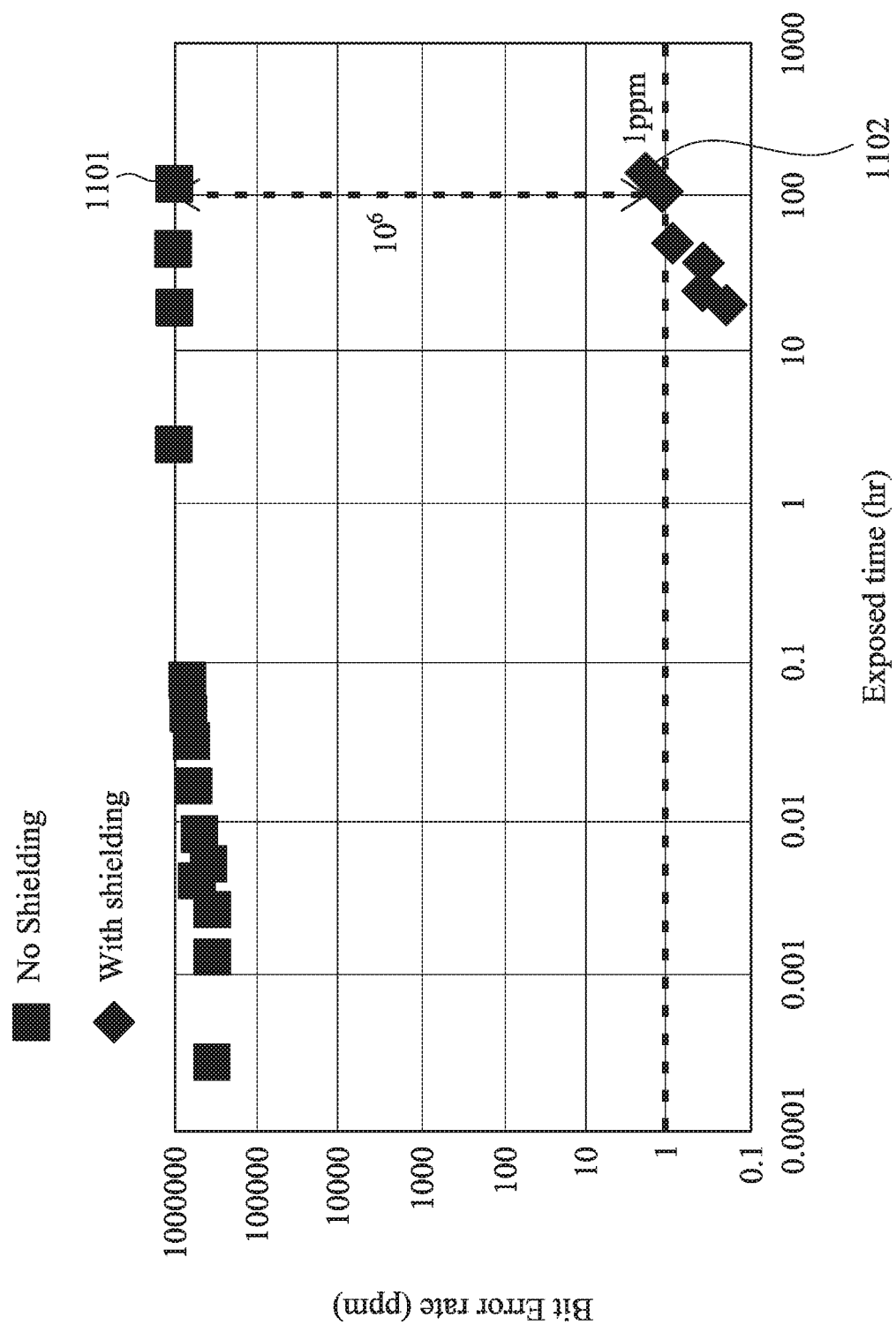
FIG. 11 is a graph illustrating experimental results of bit error rates due to a magnetic field for an unshielded device and for a device including a magnetic shielding layer, in accordance with some embodiments.

FIG. 11 is a graph illustrating experimental results of bit error rates due to a magnetic field for an unshielded device and for a device including a magnetic shielding layer, such as the device 10 shown in FIG. 1A.

In the experiment reflected by the graph of FIG. 11, the data points 1101 indicate bit error rates for the unshielded device, while the data points 1102 indicate bit error rates for the device including the magnetic shielding layer in accordance with embodiments of the present disclosure. More particularly, in the experiment, a magnet having a magnetic field strength of 3500 Oersted (Oe) was positioned at a distance of 1.5 mm from an MRAM chip for a period of time of over 100 hours.

As shown at data points 1101, the unshielded device experienced significant bit error rates nearly immediately in the presence of the magnetic field of the magnet. After 100 hours of exposure, the bit error rate of the unshielded device was nearly 1,000,000 parts per million (e.g., bit errors per million).

The device having the magnetic shielding layer included a magnetic shielding layer with a thickness about 0.3 mm. The magnetic shielding layer was formed of silicon steel. The same magnet was positioned at a distance of about 1.5 mm from the MRAM chip, and the magnetic shielding layer was positioned between the MRAM chip and the magnet. After 100 hours of exposure, the bit error rate of the device having the magnetic shielding layer was about 1 part per million, as shown at data points 1102. This reflects a reduction of about 6 orders of magnitude with respect to the unshielded device (e.g., from $10^6$ to 1 ppm).

Figure 12:
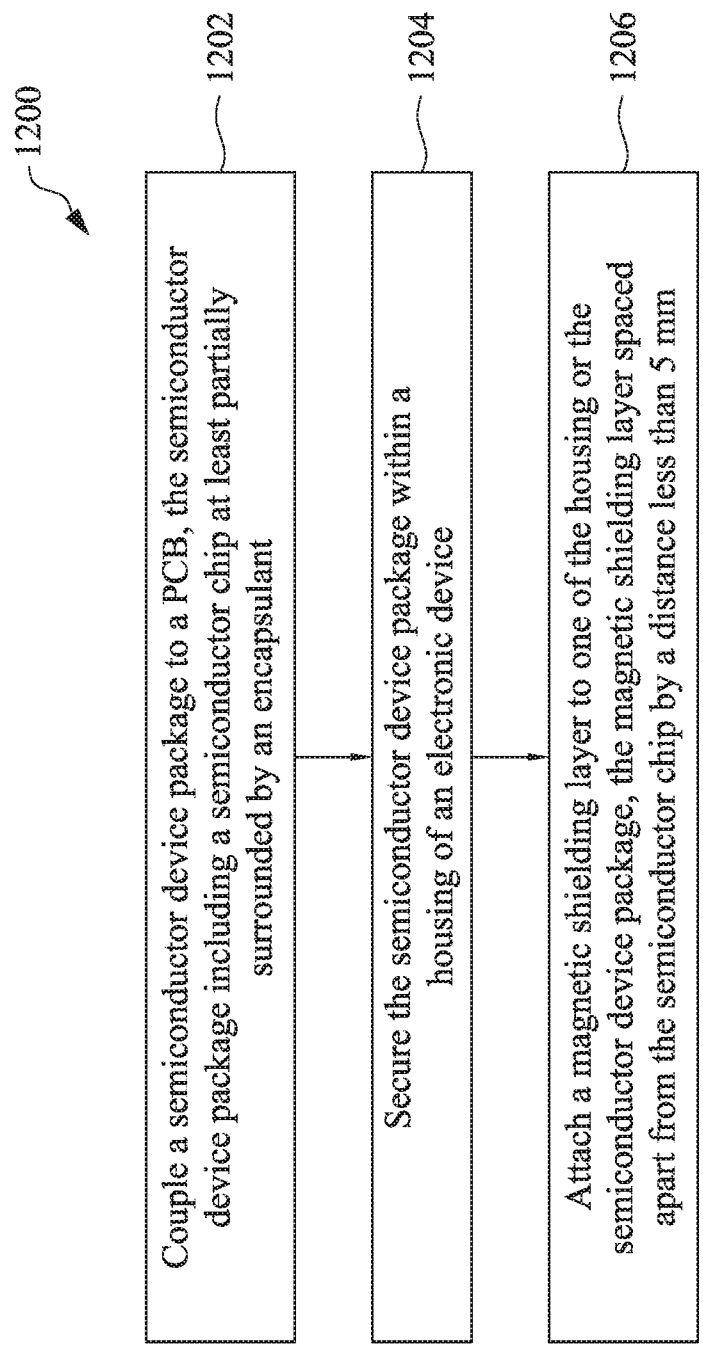
FIG. 12 is a flowchart illustrating a method of manufacturing an electronic device having a magnetic shielding layer, in accordance with some embodiments.

FIG. 12 is a flowchart 1200 illustrating a method of manufacturing an electronic device having a magnetic shielding layer, in accordance with one or more embodiments of the present disclosure.

At 1202, the method includes coupling a semiconductor device package 12 to a printed circuit board (PCB). The semiconductor device package 12 may be electrically and mechanically coupled to the PCB. The semiconductor device package 12 includes a semiconductor chip 16 at least partially surrounded by an encapsulant 18. In some embodiments, the encapsulant may be an epoxy mold compound (EPC).

At 1204, the method includes securing the semiconductor device package 12 within a housing 402 of an electronic device. The electronic device may be any electronic device, and in some embodiments, may be any of the electronic devices previously described herein. In some embodiments, the electronic device may be at least one of: a smart phone, a display device or a tablet computer device.

At 1206, the method includes attaching a magnetic shielding layer 20 to one of the housing 402 or the semiconductor device package 12. The magnetic shielding layer 20 is spaced apart from the semiconductor chip 16 by a distance less than 5 mm. In some embodiments, the magnetic shielding layer 20 is attached to a surface of the semiconductor device package 12, and the magnetic shielding layer 20 is disposed between the housing 402 of the electronic device and the semiconductor chip 16.

Embodiments of the present disclosure provide several advantages. For example, embodiments provided herein can protect magnetic sensitive devices (e.g., semiconductor chips) from harmful effects caused by interference from external magnetic fields. This may result in prevention or reduction of operational failures of such magnetic sensitive devices, including reading or writing failures and the like. Embodiments of the present disclosure may be provided in conjunction with, or may be include, semiconductor packages of various different types. Other advantages are described herein and still others will be apparent in view of the present disclosure.

According to one embodiment, a device includes a housing defining an exterior surface. A semiconductor chip is within the housing, and the semiconductor chip is spaced apart from the exterior surface of the housing. A magnetic shielding layer is spaced apart from the semiconductor chip by a distance less than 5 mm.

According to another embodiment, a device includes a substrate. A semiconductor device package is disposed on the substrate, and the semiconductor device package includes a magnetoresistive random-access memory (MRAM) chip at least partially surrounded by an encapsulant. A magnetic shielding layer is disposed on the semiconductor device package.

According to yet another embodiment, a method is provided that includes electrically and mechanically coupling a semiconductor device package to a printed circuit board (PCB), the semiconductor device package including a semiconductor chip at least partially surrounded by an encapsulant. The semiconductor device package is secured within a housing of an electronic device. A magnetic shielding layer is attached to one of the housing or the semiconductor device package, and the magnetic shielding layer is spaced apart from the semiconductor chip by a distance less than 5 mm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a substrate;
   a housing on the substrate, the housing defining an exterior surface;
   a semiconductor chip within the housing and disposed between the substrate and the exterior surface of the housing along a first direction, the semiconductor chip spaced apart from the exterior surface of the housing;
   an encapsulant on the substrate, the encapsulant completely surrounding the semiconductor chip; and
   a magnetic shielding layer, the magnetic shielding layer spaced apart from the semiconductor chip along the first direction by a distance less than 5 mm.

2. The device of claim 1, further comprising a semiconductor package, the semiconductor chip being disposed within the semiconductor package, the semiconductor package located at least partially within the housing and including the encapsulant.

3. The device of claim 2 wherein the magnetic shielding layer is at least partially embedded in the semiconductor package.

4. The device of claim 2 wherein the magnetic shielding layer is disposed between an exterior surface of the semiconductor package and the exterior surface of the housing.

5. The device of claim 4 wherein the magnetic shielding layer is disposed on the exterior surface of the semiconductor package.

6. The device of claim 2, further comprising a printed circuit board (PCB) located within the housing, the semiconductor package being electrically and mechanically coupled to the PCB.

7. The device of claim 1 wherein the magnetic shielding layer is connected to the housing.

8. The device of claim 1 wherein the magnetic shielding layer has a surface area that is greater than a surface area of the semiconductor chip.

9. The device of claim 8 wherein the magnetic shielding layer extends laterally outward beyond sides of the semiconductor chip by a distance within a range from 1 mm to 300 mm.

10. The device of claim 1 wherein the magnetic shielding layer includes a first material including at least one of: iron (Fe), cobalt (Co), nickel (Ni), NiFe, or CoFe.

11. The device of claim 10 wherein the magnetic shielding layer includes a second material including at least one of: carbon (C), molybdenum (Mo), chromium (Cr), copper (Cu), niobium (Nb), titanium (Ti), manganese (Mn), aluminum (Al), silicon (Si), tungsten (W), or vanadium (V).

12. The device of claim 11 wherein the magnetic shielding layer is formed of 80% to 100% of the first material and 0% to 20% of the second material.

13. The device of claim 1 wherein the magnetic shielding layer has a thickness that is less than 1 mm.

14. The device of claim 1 wherein the magnetic shielding layer is a multi-layer structure including a plurality of magnetic material layers and at least one insulator layer.

15. A device, comprising:
   a substrate;
   a semiconductor device package on the substrate, the semiconductor device package including a magnetoresistive random-access memory (MRAM) chip completely surrounded by an encapsulant, the MRAM chip disposed between the substrate and an exterior surface of the semiconductor device package along a first direction; and
   a magnetic shielding layer on the semiconductor device package, the magnetic shielding layer spaced apart from the MRAM chip along the first direction by a distance less than 5 mm.

16. The device of claim 15 wherein the magnetic shielding layer is spaced apart from the MRAM chip by a distance less than 5-3 mm.

17. The device of claim 15 wherein the magnetic shielding layer has a thickness within a range from 0.1 mm to 1 mm.

18. A method, comprising:
electrically and mechanically coupling a semiconductor device package to a printed circuit board (PCB), the semiconductor device package including a semiconductor chip completely surrounded by an encapsulant, the semiconductor chip disposed between the PCB and an exterior surface of the semiconductor device package along a first direction;
securing the semiconductor device package within a housing of an electronic device; and
attaching a magnetic shielding layer to one of the housing or the semiconductor device package, the magnetic shielding layer spaced apart from the semiconductor chip along the first direction by a distance less than 5 mm.

19. The method of claim 18 wherein the attaching the magnetic shielding layer comprises attaching the magnetic shielding layer to a surface of the semiconductor device package, the magnetic shielding layer disposed between the housing of the electronic device and the semiconductor chip.

20. The method of claim 18 wherein the electronic device comprises at least one of: a smart phone, a display device or a tablet computer device.

* * * * *